(12) United States Patent
Conn (10) Patent No.: US 6,998,876 B1
(45) Date of Patent: Feb. 14, 2006

(54) COAXIAL CLOCK TREE FOR PROGRAMMABLE LOGIC DEVICES

(75) Inventor: Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/820,336

(22) Filed: Apr. 8, 2004

(51) Int. Cl.
*H03K 19/00* (2006.01)

(52) U.S. Cl. .............................. 326/93; 326/41; 326/47; 326/101

(58) Field of Classification Search .................. 326/38, 326/41, 47, 93, 101
See application file for complete search history.

(56) References Cited

U.S. PATENT DOCUMENTS

| | | | |
|---|---|---|---|
| 6,879,185 B1 * | 4/2005 | Swami et al. .................. | 326/93 |
| 2001/0000426 A1 * | 4/2001 | Sung et al. .................... | 331/25 |

OTHER PUBLICATIONS

U.S. Appl. No. 10/633,727, filed Aug. 04, 2003, Conn et al.

* cited by examiner

*Primary Examiner*—Anh Q. Tran
(74) *Attorney, Agent, or Firm*—T. Lester Wallace (57) ABSTRACT

A balanced clock tree has a coaxial structure when a piece of the tree is viewed in cross-section. A plate is capacitively coupled to the inner conductor that runs down the center of the coaxial structure. This plate is usable to AC couple into the clock signal being propagated down the clock line. A programmable structure is disclosed for doing this whereby the clock signal is capacitively coupled from the clock line onto the input lead of a latch. The latch recreates the clock signal. The latch drives the recreated clock signal onto a local clock conductor. The structure is programmable in that it either couples the clock signal onto the local conductor or not depending on the state of a configuration bit in a memory cell of the programmable structure. In one embodiment, the clock tree can be tapped without substantially affecting signal propagation characteristics of the clock tree.

20 Claims, 7 Drawing Sheets

BALANCED COAXIAL CLOCK TREE

COAXIAL CLOCK TREE FOR PROGRAMMABLE LOGIC DEVICES

FIELD OF THE INVENTION

The present invention relates to a clock tree for distributing a clock signal across a programmable logic device.

BACKGROUND INFORMATION

Digital integrated circuits typically use a clock tree to distribute a clock signal from a source of the clock signal to various portions of logic on the integrated circuit that are clocked by the clock signal. In a typical integrated circuit, the circuitry that is to be clocked is not reconfigurable and does not change. The structure of the clock tree is therefore fixed at the time of manufacture of the integrated circuit and does not change regardless of how the integrated circuit is used. The physical and electrical characteristics of the clock tree are fixed. Accordingly, clock signal propagation times through the clock tree are fairly repeatable and predictable, regardless of the use to which the integrated circuit is put.

In a programmable logic device (PLD) such as a field programmable gate array (FPGA), however, the circuitry that is to be clocked can differ significantly from user design to user design. One user may wish to configure an FPGA such that a clock signal on the clock tree of the FPGA is used extensively in one part of the FPGA. Another user may wish to configure an identical FPGA such that a clock signal on the clock tree is not used at all in that part of the FPGA.

Figure 1:
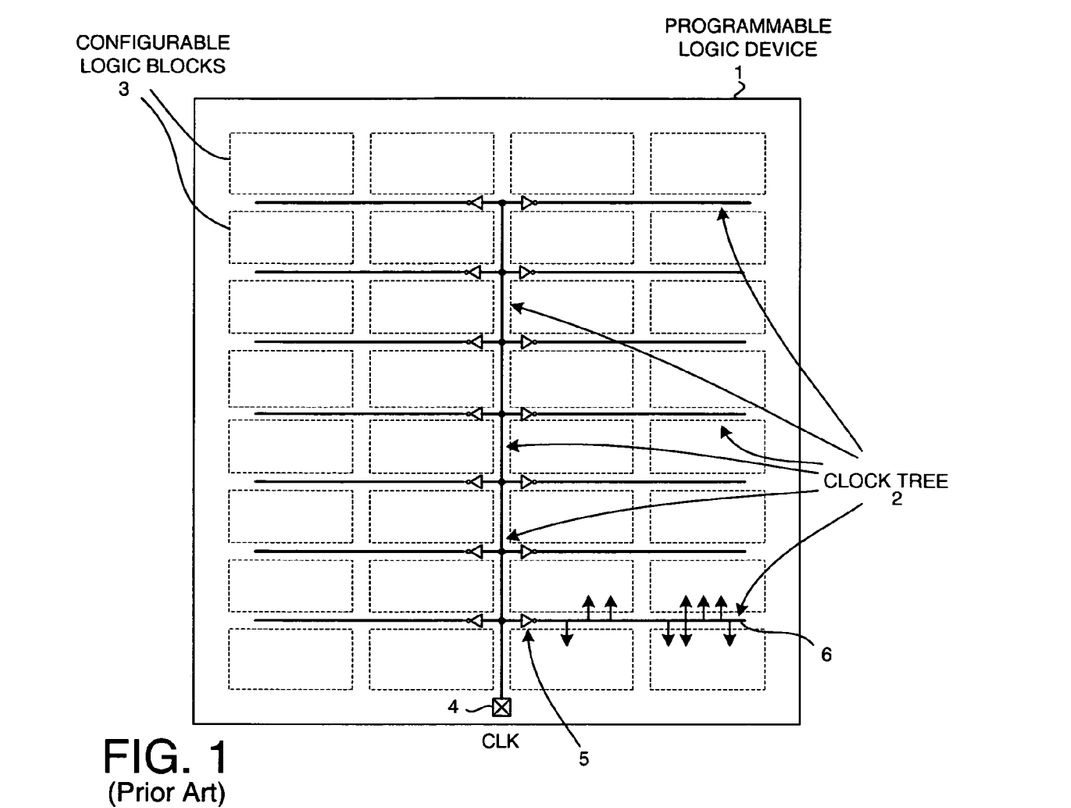
FIG. 1 (Prior Art) is a top-down diagram of an FPGA integrated circuit 1 that has a configurable clock tree 2.

FIG. 1 (Prior Art) is a top-down diagram of an FPGA integrated circuit 1 that has a configurable clock tree 2. It is to be understood that the clock tree 2 is illustrative of one example of a clock tree on an FPGA, and that many different clock tree structures are employed in FPGA integrated circuits. In FIG. 1, the blocks 3 illustrated in dashed lines represent blocks of configurable logic. In one architecture, blocks of configurable logic are called configurable logic blocks (CLBs). Circuitry within the CLBs can be interconnected in a user-definable manner by a configurable interconnect structure (not shown). The configurable interconnect structure may, for example, be disposed in the areas between the various CLBs. Configurable clock tree 2 supplies a clock signal from a clock input terminal CLK 4 to parts of the FPGA circuitry that require the clock signal. In the illustrated example, clock tree 2 extends upward from terminal 4 and then branches to the left and right out across the surface of the integrated circuit. Clock drivers 5 are provided to drive the clock signal left and right down the clock tree branches.

In the example of FIG. 1, a user can configure FPGA 1 so that selected ones of the clock drivers 5 are disabled. This effectively cuts branches off the clock tree. Because switching clock drivers consume power, disabling clock drivers that drive clock lines that are not needed reduces power consumption of the overall functioning FPGA. Although disabling a part of the clock tree in this way to reduce power consumption may be advantageous from a power consumption point of view, it may in some FPGA designs change the electrical characteristics of the remaining part of the clock tree. Capacitive loading on the remaining part of the clock tree may, for example, be reduced. Changing the electrical characteristics of the remaining part of the clock tree may affect the signal transmission characteristics of the remaining part of the clock tree. This is generally undesirable. It is generally desired that signal propagation times in the clock tree be fairly predictable and constant regardless of how the FPGA is configured.

In addition to the ability to disable a part of the clock tree, FPGA 1 includes a number of programmable taps along each horizontally extending clock conductor of clock tree 2. If the clock signal is required extensively in an area of the FPGA, then the user may configure many programmable taps to tap the clock conductor many times in the localized area. On the other hand, if the clock signal is not required extensively in the localized area, then the user may configure the FPGA only to tap the clock conductor a relatively few number of times in that localized area. In FIG. 1, programmable taps that are configured to supply a clock signal from clock conductor 6 to corresponding local conductors (not shown) are illustrated as arrows.

Figure 2:
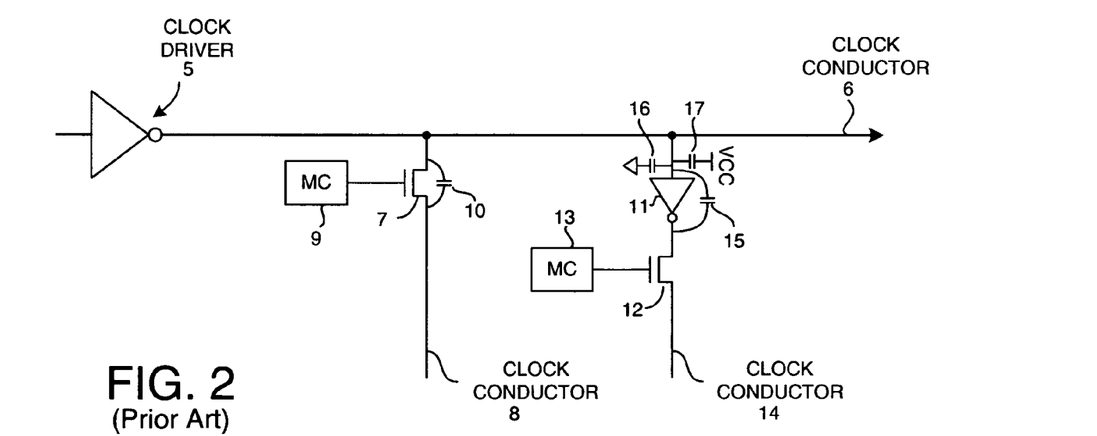
FIG. 2 (Prior Art) illustrates two ways that the configurable clock tree of FIG. 1 can be tapped.

FIG. 2 (Prior Art) illustrates two ways that such programmable tap structures can be realized. The first structure involves using a field effect transistor (FET) 7 to couple a clock signal on clock conductor 6 to a local clock conductor 8. To make this connection, FET 7 is turned on by a configuration bit stored in memory cell 9. Making this connection, however, increases the capacitive loading on clock conductor 6. When FET 7 is conductive and the clock signal on conductor 6 transitions low-to-high, current sourced from clock conductor 6 flows through the conductive FET 7 in order to charge the capacitance of local conductor 8. Similarly, when FET 7 is conductive and the clock signal transitions high-to-low, clock conductor 6 sinks current through FET 7 to discharge the capacitance of local conductor 8. As more and more of these local conductors are coupled to clock conductor 6, the loading on clock conductor 6 increases. The edge rate at which clock driver 5 can drive the clock signal down clock conductor 6 therefore decreases. This is undesirable because it is undesirable that clock signal propagation speeds in the clock tree change significantly depending on how the FPGA is configured.

Not only does the structure of FET 7 and memory cell 9 add loading to clock conductor 6 when FET 7 is turned on, but the structure also loads clock conductor 6 even if FET 7 is turned off. FET 7 has a parasitic capacitance between its source and drain as represented in FIG. 2 by capacitor symbol 10. Under high frequency AC conditions such as those present when a high frequency clock signal is present on clock conductor 6, the parasitic capacitance allows current flow between clock conductor 6 and local conductor 8, thereby loading clock conductor 6. The load on clock conductor 6 from many such FETs causes propagation through clock driver 5 to be undesirably slow.

A second conventional structure for tapping clock conductor 6 involves an inverter 11 in addition to a FET 12 and a memory cell 13. This structure further isolates the clock conductor 6 from an associated local clock conductor 14. Although this structure loads clock conductor 6 less than the structure involving FET 7, there still exists a parasitic capacitance (represented by capacitor symbol 15) associated with the transistors of inverter 11. Again, under high frequency AC conditions such as those present when a high frequency clock signal is present on clock conductor 6, the parasitic capacitance allows current to flow through or past inverter 11, thereby loading clock conductor 6. In addition, there are gate capacitances of the transistors within inverter 11. These capacitances, which are represented by capacitor symbols 16 and 17, are directly coupled to clock conductor 6. The gate capacitances 16 and 17 constitute additional loading on clock-conductor 6.

In FPGA 1, there are a great many local conductors that are programmably coupleable to clock tree 2. Each of these local conductors and/or its associated interconnection circuitry adds loading to the associated clock conductor of the clock tree. This is true even if the local conductors are not actually programmed to couple clock signals from the clock tree. Because there are so many such programmably coupleable local conductors, the clock conductors of such an FPGA clock tree can be significantly loaded. Not only are the clock conductors loaded, but propagation times through the clock tree may depend on how the FPGA is configured. If, for example, a first user configures an FPGA so that many of the programmable tap structures are enabled to tap a clock conductor at many locations, then loading on the clock conductor is greater and clock signal propagation times are slower. If, on the other hand, a second user configures an identical FPGA so that relatively few programmable tap structures are enabled to tap the clock conductor, then loading on the clock conductor is less and clock signal propagation times are faster. It is therefore seen that clock signal propagation delay through the clock tree depends on how the FPGA is configured. This is undesirable.

SUMMARY

A balanced clock tree has a coaxial waveguide structure when a clock line of the tree is viewed in cross-section. A conductive plate is capacitively coupled to the inner conductor that runs down the center of the coaxial structure. This plate is usable to AC couple into a clock signal being propagated down the inner conductor. A programmable structure allows signal edges of the clock signal to be capacitively coupled from the inner conductor and onto the input lead of a latch circuit. The latch circuit uses the signal edges to recreate the original clock signal. The latch circuit drives the recreated clock signal onto a local clock conductor. The structure is programmable in that it either couples the clock signal onto the local clock conductor or not depending on the state of a configuration bit in a memory cell of the programmable structure.

In one embodiment, the programmable structure can tap into the clock signal being carried by the coaxial clock line without significantly changing the electrical characteristics of the clock line. The clock line can therefore be tapped without substantially affecting signal propagation characteristics of the clock line. This is advantageous, particularly in programmable logic devices, where it is desired to be able to have repeatable clock tree timing regardless of whether the clock tree is tapped many times or only a few times.

In one embodiment, a programmable logic device (PLD) integrated circuit includes such a balanced clock tree and a plurality of associated programmable structures. By loading the memory cells of the programmable structures with appropriate configuration bits, the clock tree can be tapped locally many times, a few times, or not at all. Which of the programmable structures tap the clock tree is under the control of the PLD user. The memory cells of the programmable structures are chained together to form a shift-register-type structure. The configuration bits are loaded into the shift-register-type structure in serial fashion in the form of a serial configuration bit stream.

Other structures and methods are described in the detailed description below. This summary does not purport to define the invention. The invention is defined by the claims.

BRIEF DESCRIPTION OF THE FIGURES

The accompanying drawings, where like numerals indicate like components, illustrate embodiments of the invention.

DETAILED DESCRIPTION

Figure 3:
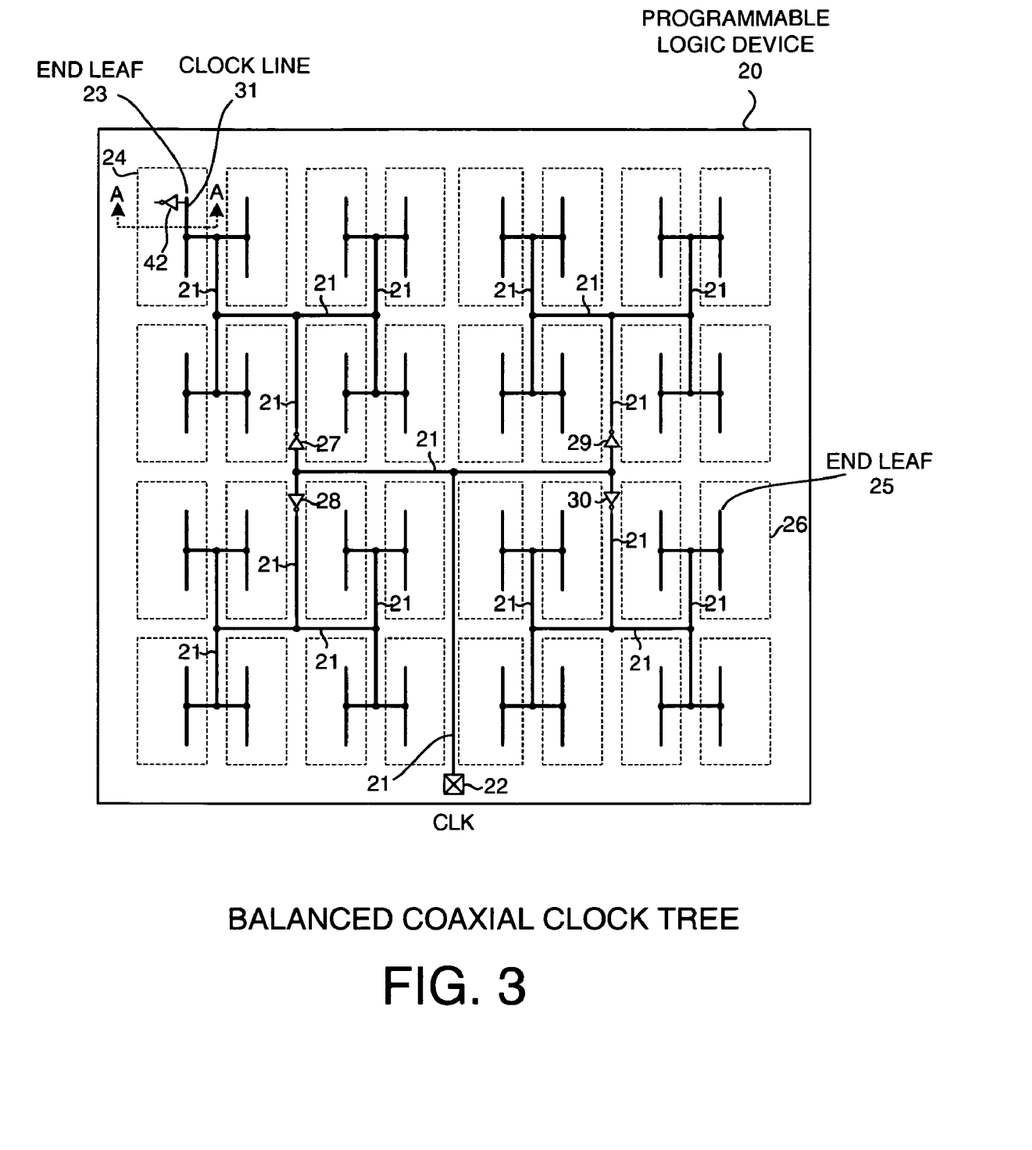
FIG. 3 is a diagram of a balanced clock tree in accordance with one embodiment of the present invention.

FIG. 3 is a simplified top-down diagram of a programmable logic device (PLD) 20 in accordance with an embodiment of the present invention. Programmable logic device 20 may, for example, be a field programmable gate array (FPGA) or a complex programmable logic device (CPLD). PLD 20 includes a plurality of blocks of logic. The blocks of logic are illustrated as dashed boxes in FIG. 3.

A balanced coaxial clock tree structure 21 extends from a clock input terminal 22 and to each of the blocks of logic. The clock tree is a balanced clock tree in that the propagation delay from the start or root of the clock tree at terminal 22 through all the branches of the clock tree and to each end leaf of the tree is substantially identical. The distance a clock signal travels through clock tree 21 from terminal 22 to end leaf 23 in logic block 24 is, for example, the same as the distance the clock signal travels through clock tree 21 from terminal 22 to a different end leaf 25 in logic block 26. Balanced coaxial clock tree structure 21 includes clock drivers 27–30 that buffer the clock signal, and to drive it farther down the various clock lines of the clock tree toward the end leaves.

Figure 4:
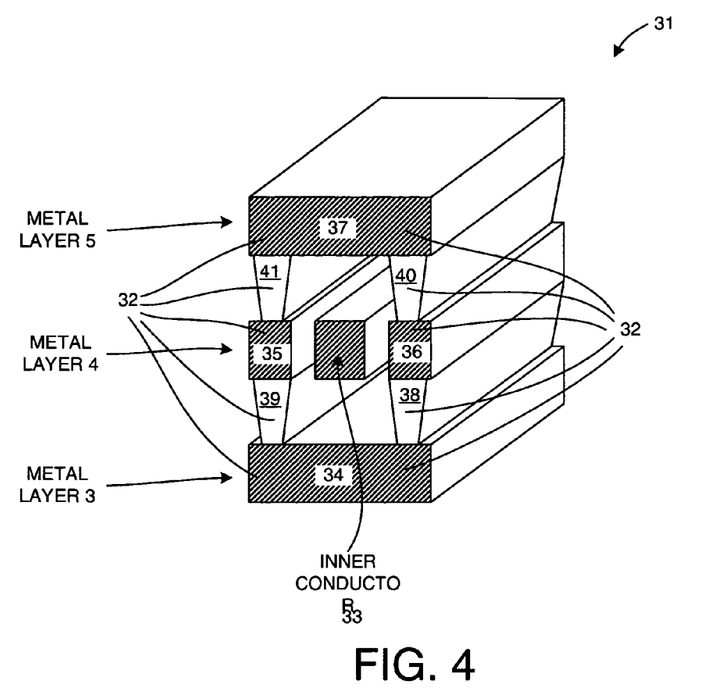
FIG. 4 is a simplified cross-sectional diagram of the clock tree of FIG. 3.

FIG. 4 is a simplified cross-sectional view of a coaxial clock line 31 of clock tree 21 of FIG. 3 taken at location A—A. Clock line 31 includes a substantially tubular outer conductor 32 and an inner conductor 33. The substantially tubular output conductor 32 in the example of FIG. 4 is a conductive tube that encloses a channel. The channel, when taken in cross-section, has a substantially rectangular shape. Inner conductor 33 extends axially inside the enclosed channel.

Outer conductor 32 includes a lower portion 34, two middle portions 35 and 36, and an upper portion 37. The lower portion may, for example, be fashioned from metal layer three of a semiconductor process used to make PLD 20. The middle portion may be fashioned from metal layer four of the process. The upper portion may be fashioned from metal layer 5 of the process.

Outer conductor 32 also includes plug portions 38–41. Each plug portion is formed by forming a trench in an insulating layer (not shown), and then filling the trench with metal. Plug portions 38–41 are therefore metal disposed in trenches in insulative layers (the insulative layers are not shown in the diagram). Plug portion 38 connects middle portion 36 to lower portion 34. Plug portion 39 connects middle portion 35 to lower portion 34. Plug portion 40 connects upper portion 37 to middle portion 36. Plug portion 41 connects upper portion 37 to middle portion 35. Plug-forming and damascene processes well known in the art can be used to form plug portions 38–41.

The volume inside the enclosed channel that is not occupied by inner conductor 33 is occupied by an insulative material otherwise used in the semiconductor process to separate metal layers. The insulative material may, for example, be silicon oxide or silicon nitride used the process to separate metal layer 3 from metal layer 4, and to separate metal layer 4 from metal layer 5. The volume may be filled with a low-k dielectric material or other material that would speed signal propagation down inner conductor 33.

In operation, a clock signal propagates down the inner conductor 33 of clock line 31 in much that same way as a signal propagates down the inner conductor of a common coaxial cable used in the home for communicating video signals into a television. Clock line 31 is, however, much smaller and is made of different materials. In contrast to unshielded or substantially unshielded clock lines in the conventional clock trees such as the clock tree of FIGS. 1 and 2 described above, the inner conductor 33 is substantially shielded by outer conductor 32 thereby reducing the amount of electromagnetic noise radiated by the clock tree.

In addition to coaxial clock tree 21, PLD 20 of FIG. 3 also includes a plurality of latch circuits that are programmably coupleable to the clock lines of clock tree 21. Although there are many such latch circuits disposed along each of the clock lines of coaxial clock tree 21, only one programmably coupleable latch circuit 42 is illustrated in FIG. 3. This latch circuit 42 is disposed along vertically extending clock line 31.

Figure 5:
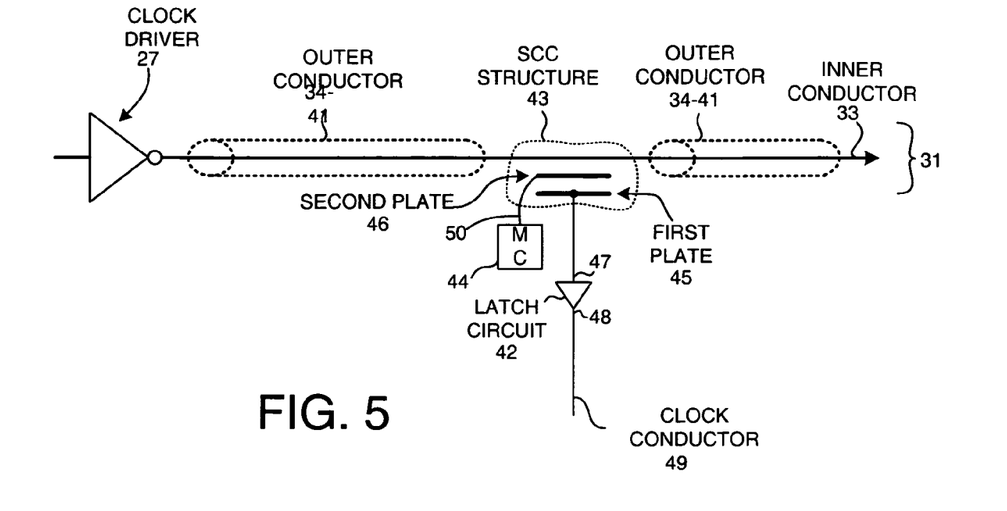
FIGS. 5 and 6 are diagrams of a first programmable circuit for tapping the clock tree of FIG. 3.

FIG. 5 is a schematic diagram that illustrates latch circuit 42, a series capacitor coupling (SCC) structure 43, a memory cell 44, the inner and output conductors of clock line 31, and the clock driver 27 that drives a clock signal down clock line 31. SCC structure 43 includes a first conductive plate 45, and a second conductive plate 46. Latch circuit 42 has an input lead 47 and an output lead 48. The input lead 47 of latch circuit 42 is connected to first plate 45 of the SCC structure 43. The output lead 48 of latch circuit 42 is connected to a local clock conductor 49. Local clock conductor 49 may, for example, extend to a clock input lead of a flip-flop or other sequential logic element within configurable logic block 24 (see FIG. 3).

Memory cell 44 has an output lead 50 which is either allowed to float or is held at a DC voltage, depending on whether a configuration bit stored in the memory cell is a digital logic high or a digital logic low. Output lead 50 of memory cell 44 is connected to second plate 46 of SCC structure 43.

Figure 6:
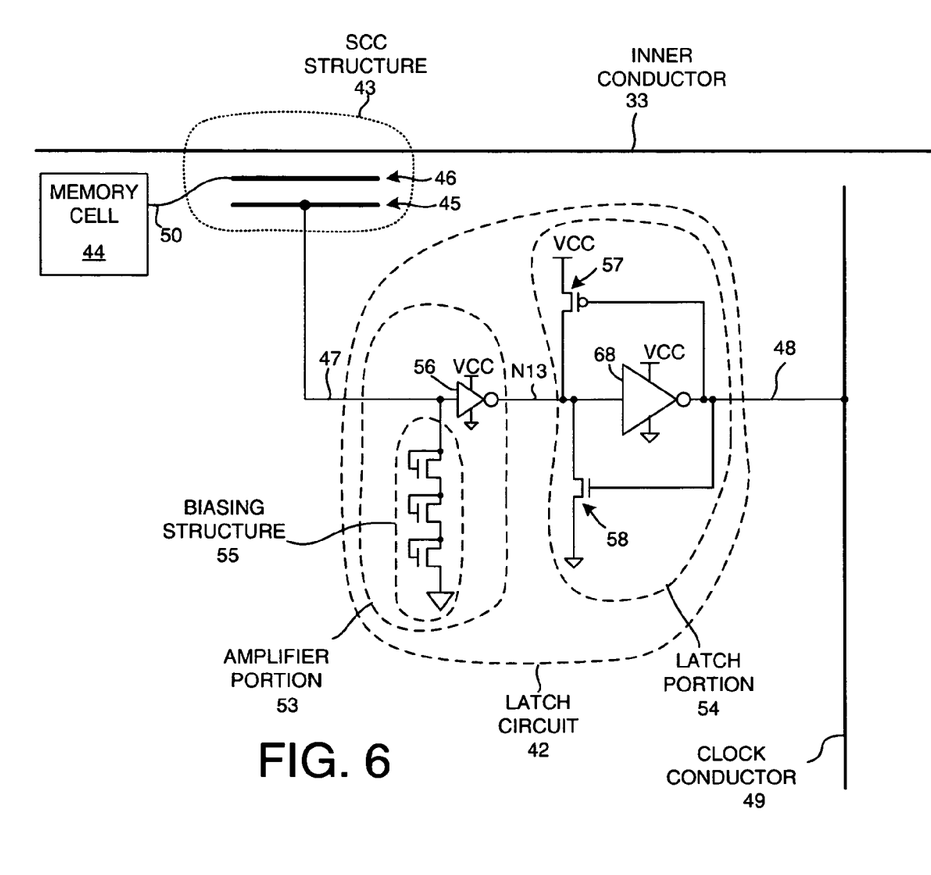
Figure 7:
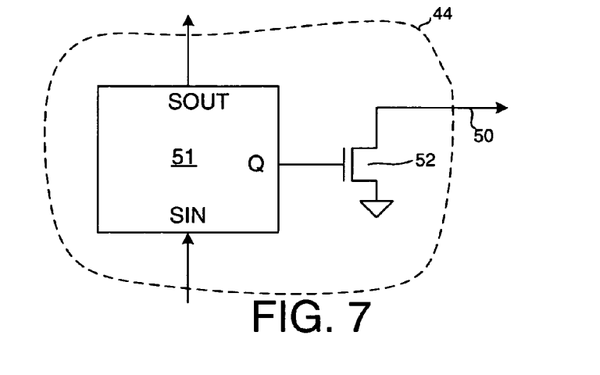
FIG. 7 is a diagram of the memory cell of the programmable circuit of FIGS. 5 and 6.

FIG. 7 is a more detailed circuit diagram of memory cell 44. Memory cell 44 includes a digital storage element 51 and a pull-down N-channel transistor 52. The digital value stored in digital storage element 51 is output onto the Q output lead of storage element 51 and to the gate of transistor 52. Accordingly, if a digital logic high is stored in storage element 51, then transistor 52 is conductive and holds the output lead 50 at ground potential. If a digital logic low is stored in storage element 51, then transistor 52 is non-conductive and output lead 50 is allowed to float. In a typical SRAM-based FPGA, there are many configuration memory cells that hold configuration data. These configuration memory cells are typically loaded with configuration data in serial fashion by shifting a serial configuration bit stream through a string of configuration memory cells. In one embodiment of the present invention, storage element 51 has serial input and serial output leads and these leads are used to incorporate storage element 51 into the string of configuration memory cells such that the serial configuration bit stream flows through storage element 51 and such that one bit of that bit stream remains in storage element 51 to configure memory cell 44 as desired by the user. If the user wishes to capacitively couple the input lead 47 (see FIG. 6) of latch circuit 42 to inner conductor 33 of clock line 31, then storage element 51 is loaded with a digital logic low. If, on the other hand, the user wishes latch circuit 42 to be decoupled from inner conductor 33 of clock line 31, then storage element 51 is loaded with a digital logic high.

General operation of latch circuit 42 is explained in connection with FIGS. 6 and 7. Latch circuit 42 includes an amplifier portion 53 and a latch portion 54. Amplifier portion 53 includes a biasing structure 55 and an inverter 56. The biasing structure 55 biases the voltage on the input lead of inverter 56 near the switching point of inverter 56 such that a voltage close to the switching point will be present on the input lead of inverter 56 under steady state DC conditions.

Latch portion 54, in this embodiment, is a cross-coupled inverter latch involving one larger inverter 68 and one smaller feedback inverter. The smaller feedback inverter is illustrated in FIG. 6 as its component P-channel pull-up transistor 57 and its component N-channel pull-down transistor 58.

Consider first the situation where memory cell 44 is loaded with a digital logic value such that second plate 46 of the SCC structure is allowed to float. The biasing structure 55 has biased the voltage on first plate 45 to a voltage close to the switching point of inverter 56. If a low-to-high signal edge of a clock signal then propagates down inner conductor 33 of clock line 31, then this signal edge will be capacitively coupled through second plate 46 and onto first plate 45 of SCC structure 43. Because first plate 45 is connected to input lead 47 of latch circuit 42, the signal edge is amplified by inverter 56 and is latched by latch portion 54.

Figure 8:
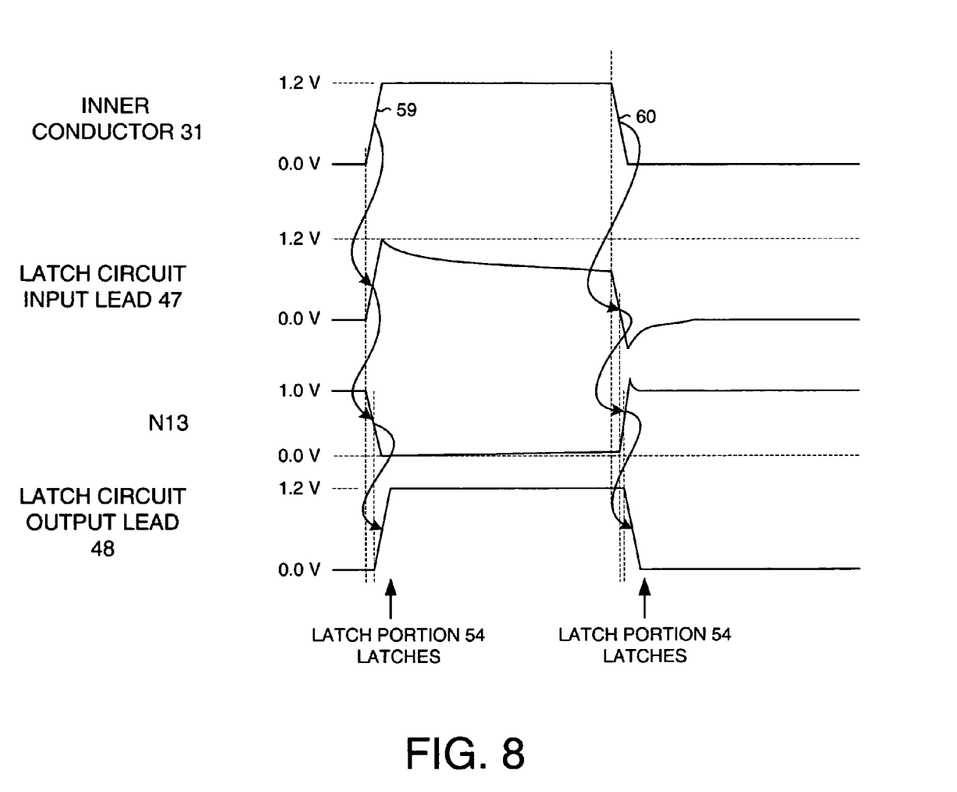
FIG. 8 is a waveform diagram that illustrates an operation of the programmable circuit of FIGS. 5 and 6.

FIG. 8 is a waveform diagram of the signals on the various nodes in the circuit of FIG. 6. Note that the rising edge 59 of the original clock signal on clock line 31 is communicated through SCC structure 43 and latch circuit 42 and appears on the output lead 48 of the latch circuit 42. Latch circuit 42 is latched such that latch circuit 42 continues to drive a digital logic high voltage onto output lead 48.

If a high-to-low signal edge 60 then propagates down inner conductor 33 of clock line 31, this signal edge is capacitively coupled through second plate 46 and onto first plate 45 of SCC structure 43. This signal edge is amplified by amplifier portion 53 and is latched into latch circuit 42. The digital logic state stored by latch circuit 54 switches from a digital logic high to a digital logic low. In the waveform diagram of FIG. 8, note that falling edge 60 of the original clock signal on clock line 31 is communicated through SCC structure 43 and latch circuit 42 and appears on the output lead 48 of the latch circuit 42. Latch circuit 42 is latched such that latch circuit 42 continues to drive a digital logic low voltage onto output lead 48. As is evident from comparing the waveform of the incoming signal in the top waveform of FIG. 8 with the waveform of the output signal in the bottom waveform of FIG. 8, the circuit of FIGS. 5 and 6 recreates the incoming signal on conductor 33 and outputs the recreated signal onto local clock conductor 49.

Consider next a situation in which memory cell 44 is loaded with a digital logic value such that second plate 46 of SCC structure 43 is held at ground potential. In this case, the first plate 45 of SCC structure 43 is capacitively de-coupled from inner conductor 33 of clock line 31 due to the second plate being held at a fixed DC potential. If a signal edge (either low-to-high or high-to-low) were to propagate down clock line 31, this signal would not be capacitively coupled onto input lead 47 of latch circuit 42. The digital logic value latched into latch circuit 42 is therefore not affected.

For additional details on the operation and structure of an SCC and latch circuit structure, see: U.S. patent application Ser. No. 10/633,727, entitled "Series Capacitor Coupling Multiplexer For Programmable Logic Devices", filed Aug. 4, 2003, by Robert O. Conn et al. (the subject matter of which is incorporated herein by reference).

Figure 9:
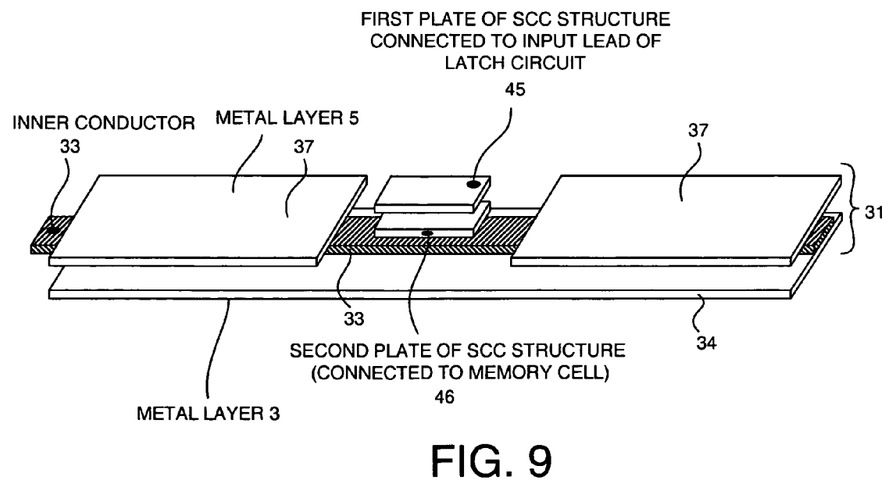
FIG. 9 is a partial perspective view of coaxial clock line 31 showing how second plate 46 is sandwiched between inner conductor 33 and first plate 45.

FIG. 9 is a partial perspective view of coaxial clock line 31 showing how second plate 46 is sandwiched between inner conductor 33 and first plate 45. The plug portions 38–41 (see FIG. 4) of outer conductor 32 are not shown in FIG. 9 so that the relationships of the remaining portions of the clock line structure will be easier to see. In this example, second plate 46 is disposed in an opening in the upper portion 37 of the outer conductor. Second plate 46 is a portion of metal layer 5 in the same way that upper portion 37 is a portion of metal layer 5. First plate 45 is a plate formed of a metal layer 6 that is disposed over metal layer 5. First plate 45 is separated and insulated from second plate 46 by an insulative layer that is used to separate metal layer 6 from metal layer 5 elsewhere on the integrated circuit.

Of importance, the SCC and latch circuit structure of FIGS. 5 and 6 adds very little capacitive load to clock line 31 because the second plate of the SCC structure can be made quite small. The capacitance between the second plate 46 and inner conductor 33 can be small on the order of 0.1 picofarads when clock line 31 is programmed to be decoupled from local clock conductor 49. When clock line 31 is programmed to be coupled to the input lead of latch circuit 42, on the other hand, the capacitive loading on clock line 31 actually decreases. This is in contrast to the case of the prior art structures of FIG. 2 where loading on the clock line increases when the clock line is tapped. Allowing second plate 46 of SCC structure 43 to float places a second capacitor (a capacitance between first plate 45 and second plate 46) in series with a first capacitance between second plate 46 and inner conductor 33. Placing the second capacitor in series with the first capacitance reduces the capacitive loading on clock line 31. In some instances, due to decreased capacitive loading, clock signal propagation delay down clock line 31 may remain constant or may actually decrease when input lead 47 of latch circuit 42 is capacitively coupled to the clock line.

Figure 10:
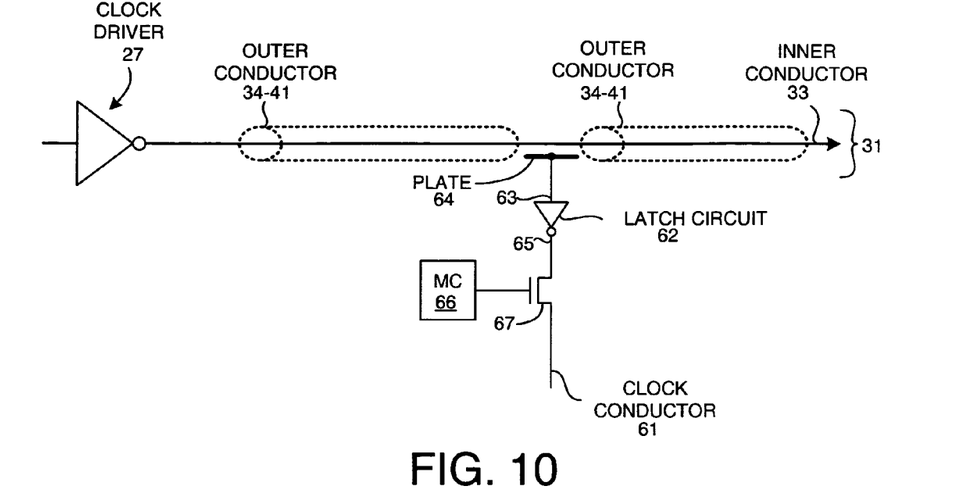
FIGS. 10 and 11 are diagrams of a second programmable circuit for tapping the clock tree of FIG. 3.

FIG. 10 is a simplified diagram of another embodiment of a circuit for programmably coupling a local clock conductor (local clock conductor 61 in this example) to clock line 31. Latch circuit 62 in the embodiment of FIG. 10 is identical to latch circuit 42 of FIGS. 5 and 6.

Figure 11:
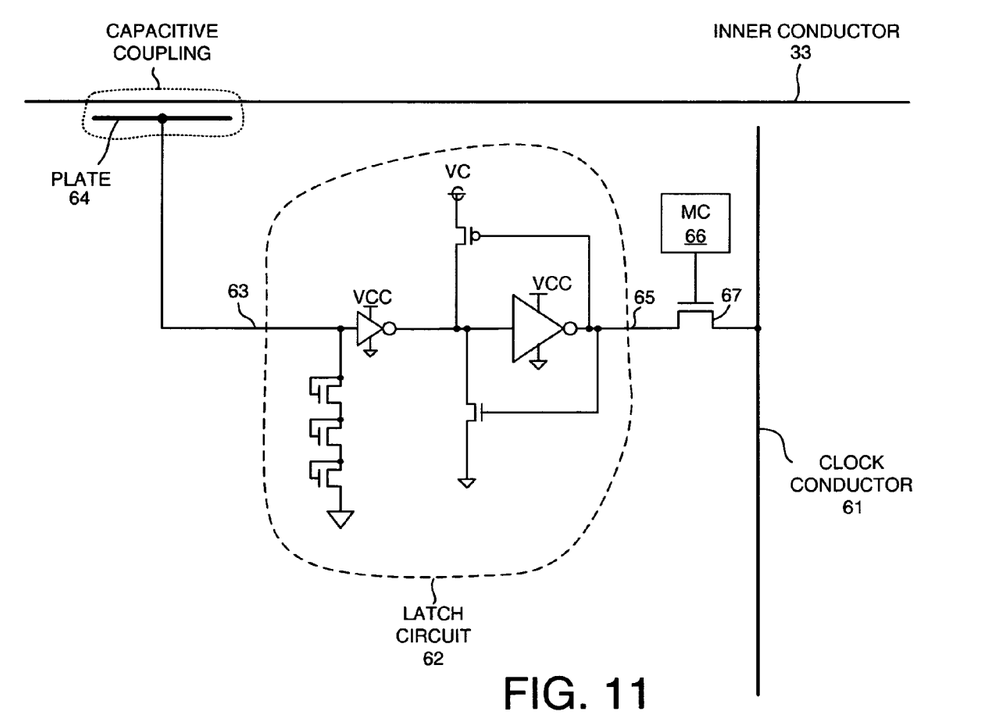

FIG. 11 is a more detailed diagram showing details of the structure of one example of latch circuit 62. Whereas the input lead of the latch circuit of FIGS. 5 and 6 can be programmably coupled and/or de-coupled from inner conductor, the input lead 63 of latch circuit 62 is permanently capacitively coupled to inner conductor 33 via conductive plate 64. Plate 64 is disposed in an opening in the metal of the outer conductor of clock line 31 as second plate 46 is in the diagram of FIG. 9. In the embodiment of FIGS. 10 and 11, however, there is no first plate. Rather, the input lead 63 of the latch circuit 62 is coupled to the plate (plate 64) in the opening in the outer conductor.

In operation, edges of a signal on inner conductor 33 are capacitively coupled onto plate 64 and are latched into latch circuit 62. A low-to-high signal edge on inner conductor 33 causes latch circuit 62 to latch a digital logic high value and to output a digital logic high value onto output lead 65. A high-to-low signal edge on inner conductor 33 causes latch circuit 62 to latch a digital logic low value and to output a digital logic low value onto output lead 65. Output lead 65 can be coupled to local clock conductor 61 and can be de-coupled from local clock conductor 61 by loading a memory cell 66 with an appropriate configuration bit. A configuration bit of a digital logic high will cause N-channel transistor 67 to be conductive, thereby coupling the output lead 65 of latch circuit 62 to local conductor 61. A configuration bit of a digital logic low will cause N-channel transistor 67 to be non-conductive, thereby de-coupling the output lead 65 of latch circuit 62 from local conductor 61. Memory cell 66 of the embodiment of FIGS. 10 and 11 has the same structure as, and is loaded in the same way as, memory cell 44 of the embodiment of FIGS. 5 and 6.

Figure 12:
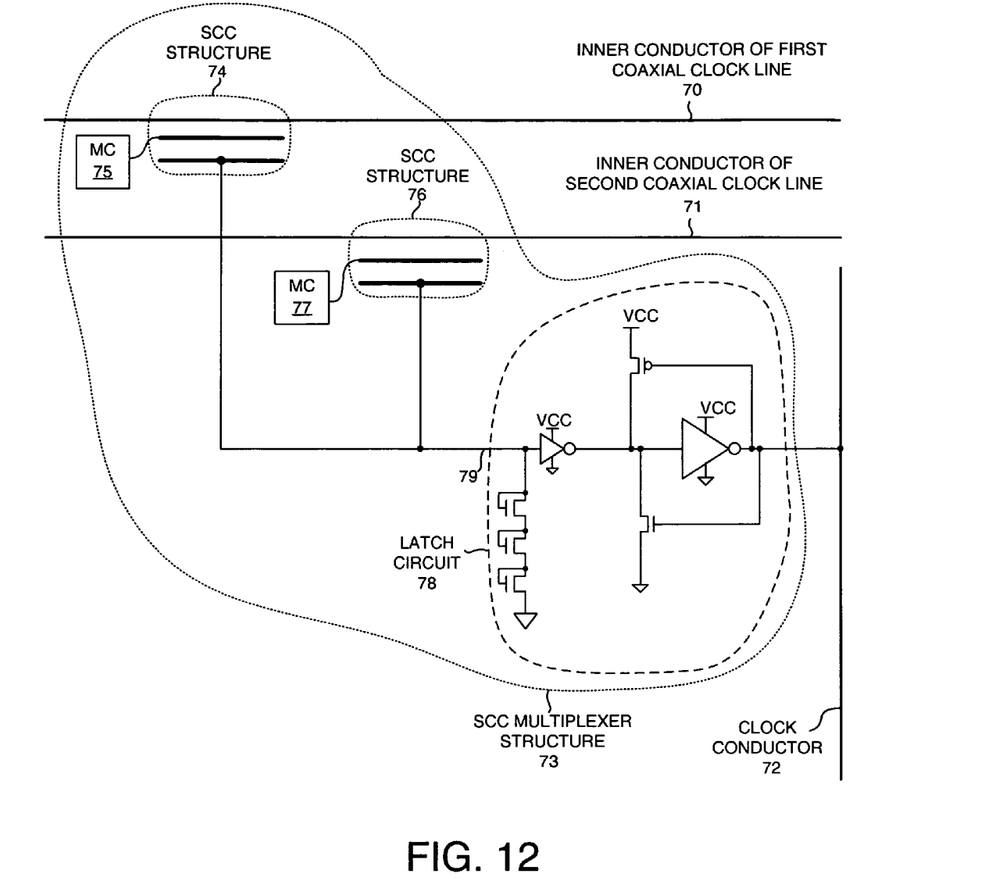
FIG. 12 is a diagram of a programmable multiplexer circuit for tapping a selected one of a first clock line and a second clock line.

FIG. 12 is a simplified diagram of an embodiment in which a clock signal from a programmable one of an inner conductor 70 of a first coaxial clock line and an inner conductor 71 of a second clock line is supplied onto a local clock conductor 72 using a series capacitor coupling (SCC) multiplexer structure 73. The SCC multiplexer structure 73 includes a first SCC structure 74 and associated configuration memory cell 75, a second SCC structure 76 and associated configuration memory cell 77, and a latch circuit 78. If a clock signal on the first coaxial clock line is to be coupled onto local conductor 72, then a configuration bit is loaded into memory cell 75 that causes the inner conductor of the first coaxial clock line to be capacitively coupled to the input lead 79 of the latch circuit 78. A configuration bit is loaded into memory cell 77 that causes the inner conductor of the second coaxial clock line to be capacitively decoupled from the input lead 79 of the latch circuit 78.

If, on the other hand, a clock signal on the second coaxial clock line is to be coupled onto local conductor 72, then a configuration bit is loaded into memory cell 75 that causes the inner conductor of the first coaxial clock line to be capacitively decoupled from the input lead 79 of the latch circuit 78. A configuration bit is loaded into memory cell 77 that causes the inner conductor of the second coaxial clock line to be capacitively coupled to the input lead 79 of the latch circuit 78.

If neither of the two coaxial clock lines is to be tapped, then memory cells 75 and 77 are loaded with configuration bits that cause the input lead 79 of the latch circuit 78 to be decoupled from each of the inner conductors 70 and 71. Although two memory cells 75 and 77 are illustrated here, one memory cell may be used. When the configuration bit stored in the memory cell has a first digital logic value, then the first coaxial clock line is coupled to the input lead of the latch circuit 78 and the second coaxial clock line is decoupled from the input lead of the latch circuit 78, whereas when the configuration bit stored in the memory cell has a second digital logic value, then the first coaxial clock line is decoupled from the input lead of the latch circuit 78 and the second coaxial clock line is coupled to the input lead of the latch circuit 78. Other embodiments of SCC multiplexer structures are possible. For additional details on SCC multiplexer structures usable in accordance with the embodiment of FIG. 12 to tap a selected one of a plurality of coaxial clock lines, see: U.S. patent application Ser. No. 10/633,727, entitled "Series Capacitor Coupling Multiplexer For Programmable Logic Devices", filed Aug. 4, 2003, by Robert O. Conn et al. (the subject matter of which is incorporated herein by reference).

Although certain specific exemplary embodiments are described above in order to illustrate the invention, the invention is not limited to the specific embodiments. Although a programmably tappable coaxial clock tree is described above in connection with a programmable logic device, the programmably tappable coaxial clock tree is usable in other types of integrated circuits. The outer conductor of a programmably tappable clock line need not entirely surround the inner conductor when the clock line is taken in cross-section, but rather the clock line may be shielded on the top and bottom but not on the sides. Accordingly, various modifications, adaptations, and combinations of various features of the described embodiments can be practiced without departing from the scope of the invention as set forth in the following claims.

What is claimed is:

1. An integrated circuit, comprising:
   a clock tree comprising a coaxial clock line, the coaxial clock line comprising a substantially tubular outer conductor and an inner conductor, the substantially tubular outer conductor forming a substantially enclosed channel that extends in a direction, and wherein the inner conductor extends in the direction axially inside the substantially enclosed channel; and
   a latch circuit having an input lead and an output lead, the input lead of the latch circuit being programmably capacitively coupleable to the inner conductor of the coaxial clock line.

2. The integrated circuit of claim 1, wherein the input lead of the latch circuit is connected to a first conductive plate, wherein a second conductive plate is disposed at least in part in an opening in the substantially tubular outer conductor, wherein the input lead of the latch circuit is capacitively coupled to the inner conductor when the second conductive plate is floating, and wherein the input lead of the latch circuit is not capacitively coupled to the inner conductor when the second conductive plate is driven with a DC voltage.

3. The integrated circuit of claim 2, wherein the DC voltage is ground potential.

4. The integrated circuit of claim 2, wherein the first conductive plate has a planar surface disposed in a first plane, and wherein the second conductive plate has a planar surface disposed in a second plane, the first conductive plane being parallel to the second plane such that the first plane does not intersect the second plane.

5. The integrated circuit of claim 2, wherein the second conductive plate is disposed between the inner conductor and the first conductive plate.

6. The integrated circuit of claim 2, further comprising:
   a memory cell having an output lead that is coupled to the second conductive plate.

7. The integrated circuit of claim 1, wherein a signal having an edge is present on the inner conductor, and wherein the edge is coupled onto the input lead of the latch circuit thereby causing the latch circuit to switch from storing a first digital logic value to storing a second digital logic value.

8. The integrated circuit of claim 1, wherein the substantially enclosed channel has a substantially rectangular cross-sectional shape.

9. The integrated circuit of claim 1, further comprising:
   a second latch circuit having an input lead and an output lead, the input lead of the second latch circuit being programmably capacitively coupleable to the inner conductor of the coaxial clock line.

10. An integrated circuit, comprising:
    a clock tree comprising a coaxial clock line, the coaxial clock line comprising a substantially tubular outer conductor and an inner conductor, the substantially tubular outer conductor forming a substantially enclosed channel that extends in a direction, and wherein the inner conductor extends in the direction axially inside the substantially enclosed channel; and
    a latch circuit having an input lead and an output lead, the input lead of the latch circuit being capacitively coupled to the inner conductor of the coaxial clock line.

11. The integrated circuit of claim 10, further comprising:
    a clock conductor; and
    a configuration memory cell that stores a bit of configuration data, wherein the latch circuit is enabled to drive a signal onto the clock conductor if the bit of configuration data has a first digital logic value, and wherein the latch circuit is disabled from driving a signal onto the clock conductor if the bit of configuration data has a second digital logic value.

12. The integrated circuit of claim 11, wherein a first terminal of a field effect transistor is coupled to the output lead of the latch circuit, wherein a second terminal of the field effect transistor is coupled to the clock conductor, and wherein a third terminal of the field effect transistor is coupled to an output lead of the configuration memory cell.

13. A method, comprising:
    distributing a clock signal via a clock tree across an integrated circuit to a plurality of latch circuits, each of the latch circuits having an input lead; and
    loading configuration data into a plurality of configuration memory cells, wherein a bit of configuration data is stored in each configuration memory cell, the bit of configuration data stored in a configuration memory cell determining whether the input lead of an associated one of the latch circuits is capacitively coupled to the clock tree.

14. The method of claim 13, wherein the input lead of each of the latch circuits is coupled to a conductive plate, the method further comprising:
    providing a bias voltage on the input lead of each of the latch circuits.

15. A method, comprising:
    distributing a clock signal via a clock tree across an integrated circuit to a plurality of latch circuits, each of the plurality of latch circuits having an input lead that is capacitively coupled to the clock tree, each of the plurality of latch circuits having an associated clock conductor; and
    loading configuration data into a plurality of configuration memory cells, wherein a bit of configuration data is stored in each configuration memory cell, the bit of configuration data stored in a configuration memory cell determining whether an associated one of the latch circuits is enabled to drive a signal onto the clock conductor associated with the latch circuit.

16. The method of claim 15, method further comprising:
providing a bias voltage on the input lead of each of the plurality of latch circuits.

17. An integrated circuit comprising:
a coaxial clock tree;
a clock conductor; and
means for capacitively coupling to the coaxial clock tree such that a clock signal present on the coaxial clock tree is capacitively coupled into the means and is supplied by the means onto the clock conductor if the means is configured in a first way, and wherein the clock signal present on the coaxial clock tree is not capacitively coupled into the means and is not supplied by the means onto the clock conductor if the means is configured in a second way.

18. The integrated circuit of claim 17, further comprising:
a memory cell, wherein the means is configured in the first way when the memory cell stores a first digital logic value, and wherein the means is configured in a second way when the memory cell stores a second digital logic value.

19. The integrated circuit of claim 18, wherein a second plate is disposed between the first plate and the coaxial clock line, the second plate being coupled to an output lead of the memory cell.

20. The integrated circuit of claim 17, wherein the means comprises a first plate that is capacitively coupled to the coaxial clock line if the means is configured in the first way, wherein the means further comprises a latch circuit, the latch circuit having an input lead and an output lead, the input lead of the latch circuit being coupled to the first plate, the output lead of the latch circuit being coupled to the clock conductor.

* * * * *